(12) United States Patent
Kim et al.

(10) Patent No.: US 11,793,011 B2
(45) Date of Patent: Oct. 17, 2023

(54) QUANTUM DOT DEVICE AND DISPLAY DEVICE

(71) Applicant: SAMSUNG ELECTRONICS CO., LTD., Suwon-si (KR)

(72) Inventors: Sung Woo Kim, Hwaseong-si (KR); Tae Ho Kim, Suwon-si (KR); Eun Joo Jang, Suwon-si (KR); Hongkyu Seo, Anyang-si (KR); Sang Jin Lee, Seoul (KR); Dae Young Chung, Suwon-si (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 84 days.

(21) Appl. No.: 17/387,281

(22) Filed: Jul. 28, 2021

(65) Prior Publication Data

US 2021/0359238 A1    Nov. 18, 2021

Related U.S. Application Data

(63) Continuation of application No. 16/034,442, filed on Jul. 13, 2018, now abandoned.

(30) Foreign Application Priority Data

Nov. 20, 2017   (KR) .................. 10-2017-0155034

(51) Int. Cl.
*H10K 50/115*   (2023.01)
*H10K 50/11*    (2023.01)
(Continued)

(52) U.S. Cl.
CPC .......... *H10K 50/115* (2023.02); *H10K 50/11* (2023.02); *H10K 50/171* (2023.02); *H10K 50/81* (2023.02);
(Continued)

(58) Field of Classification Search
CPC .............. H01L 51/502; H01L 51/5092; H01L 2251/5369; H10K 50/115; H10K 50/171; H10K 2101/40
See application file for complete search history.

(56) References Cited

U.S. PATENT DOCUMENTS 5,537,000 A    7/1996   Takase et al.
8,609,245 B2   12/2013  Jang et al.
(Continued)

FOREIGN PATENT DOCUMENTS

CN    102255019 A    11/2011
CN    103022898 A    4/2013
(Continued)

OTHER PUBLICATIONS

Office Action dated Nov. 10, 2021, of the corresponding European Patent Application No. 18202124.6.
(Continued)

*Primary Examiner* — Matthew C Landau
*Assistant Examiner* — Mark Hatzilambrou
(74) *Attorney, Agent, or Firm* — CANTOR COLBURN LLP (57) ABSTRACT

A quantum dot device includes: a first electrode and a second electrode facing each other; a quantum dot layer between the first electrode and the second electrode, and an electron auxiliary layer between the quantum dot layer and the second electrode, the electron auxiliary layer including a first nanoparticle and a second nanoparticle which is larger than the first nanoparticle, wherein a work function of the first electrode is greater than a work function of the second electrode, and wherein a difference between a lowest unoccupied molecular orbital energy level of the quantum dot
(Continued)

layer and a lowest unoccupied molecular orbital energy level of the electron auxiliary layer is less than about 1.1 electronvolts.

20 Claims, 5 Drawing Sheets

(51) Int. Cl.
*H10K 50/81* (2023.01)
*H10K 50/82* (2023.01)
*H10K 50/17* (2023.01)
*H10K 50/18* (2023.01)
*H10K 101/40* (2023.01)
*H10K 101/30* (2023.01)
*H10K 71/00* (2023.01)
*H10K 50/15* (2023.01)
*H10K 71/12* (2023.01)
*H10K 85/10* (2023.01)
*H10K 102/00* (2023.01)

(52) U.S. Cl.
CPC ............. *H10K 50/82* (2023.02); *H10K 71/00* (2023.02); *H10K 50/15* (2023.02); *H10K 50/17* (2023.02); *H10K 50/18* (2023.02); *H10K 71/12* (2023.02); *H10K 85/115* (2023.02); *H10K 85/1135* (2023.02); *H10K 2101/30* (2023.02); *H10K 2101/40* (2023.02); *H10K 2102/00* (2023.02); *H10K 2102/331* (2023.02); *H10K 2102/351* (2023.02); *H10K 2102/361* (2023.02)

(56) References Cited

U.S. PATENT DOCUMENTS

| | | |
|---|---|---|
| 9,073,752 B2 | 7/2015 | Kang et al. |
| 9,525,148 B2 | 12/2016 | Kazlas et al. |
| 9,755,172 B2 | 9/2017 | Kazlas et al. |
| 9,793,505 B2 | 10/2017 | Zhou et al. |
| 10,164,205 B2 | 12/2018 | Kazlas et al. |
| 10,179,876 B2 | 1/2019 | Jun et al. |
| 2008/0156371 A1 | 7/2008 | LoCascio et al. |
| 2010/0159248 A1 | 6/2010 | Jang et al. |
| 2011/0140075 A1* | 6/2011 | Zhou ................. H01L 51/5048 |
| 2011/0284819 A1 | 11/2011 | Kang et al. |
| 2012/0292594 A1 | 11/2012 | Zhou et al. |
| 2013/0146838 A1 | 6/2013 | Ku et al. |
| 2014/0238482 A1 | 8/2014 | Ichibayashi et al. |
| 2014/0302627 A1 | 10/2014 | Ko et al. |
| 2015/0218442 A1 | 8/2015 | Jun et al. |
| 2017/0018742 A1 | 1/2017 | Wilson et al. |
| 2017/0092890 A1 | 3/2017 | Seo et al. |
| 2017/0186985 A1 | 6/2017 | Kim et al. |
| 2018/0013088 A1 | 1/2018 | Zhou et al. |

FOREIGN PATENT DOCUMENTS

| | | |
|---|---|---|
| CN | 104818019 A | 8/2015 |
| CN | 106601884 A | 4/2017 |
| JP | 2015079838 A | 4/2015 |
| JP | 2017509132 A | 3/2017 |
| KR | 1020100071700 A | 6/2010 |
| KR | 20130065320 A | 6/2013 |
| KR | 101539294 B1 | 7/2015 |
| KR | 101626525 B1 | 5/2016 |
| WO | 2009123763 A3 | 12/2009 |
| WO | 2012128173 A1 | 9/2012 |

OTHER PUBLICATIONS

Yizhe Sun et al., Supporting Information, "Efficient quantum dot light-emitting diodes with a Zn0.85Mg0.15O interfacial modification layer", Electronic Supplementary Material (ESI) for Nanoscale, 2017, pp. 1-4.

Extended European Search Report dated Mar. 27, 2019, of the corresponding European Patent Application No. 18202124.6.

Hyo-Min Kim et al."Metal-Oxide Stacked Electron Transport Layer for Highly Efficient Inverted Quantum-Dot Light Emitting Diodes," ACS Applied Materials & Interfaces, Oct. 3, 2016, pp. 28727-28736, vol. 8, No. 42, XP055570649, US ISSN: 1944-8244, DOI: 10.1021/acsami.6b10314.

Jiangyong Pan et al., "Size Tunable ZnO Nanoparticles to Enhance Electron Injection in Solution Processed QLEDs," ACS Photonics, Jan. 22, 2016, pp. 215-222, vol. 3, No. 2, XP055570635, ISSN: 2330-4022, DOI: 10.1021/acsphotonics.5b00267.

Jong-Hoon Kim et al., "Performance Improvement of Quantum Dot-Light-Emitting Diodes Enabled by an Alloyed ZnMgO Nanoparticle Electron Transport Layer," Chemistry of Materials, Dec. 9, 2014, pp. 197-204, vol. 27, No. 1, https://doi.org/10.1021/cm503756q.

Sheng Cao et al., "Enhancing the Performance of Quantum Dot Light-Emitting Diodes Using Room-Temperature-Processed Ga-Doped ZnO Nanoparticles as the Electron Transport Layer," ACS Applied Materials & Interfaces, Apr. 19, 2017, pp. 15605-15614, vol. 9, No. 18, XP055570629, US ISSN: 1944-8244, DOI: 10.1021/acsami.7b03262.

Yizhe Sun et al., "Efficient quantum dot light-emitting diodes with a Zn0.85Mg0.15O interfacial modification layer", Nanoscale, DOI:10.1039/C7NR02099F, May 5, 2017, pp. 8962-8969, vol. 9, The Royal Society of Chemistry 2017.

Zhigang Yin et al., "Controllable ZnMgO Electron-Transporting Layers for Long-Term Stable Organic Solar Cells with 8.06% Efficiency after One-Year Storage", Advanced Energy Materials 2016, DOI: 10.1002/aenm.201501493, Nov. 27, 2015, pp. 1-10, vol. 6, Issue 4, wileyonlinelibrary (https://doi.org/10.1002/aenm.201501493).

Jong-Hoon Kim et al., "Performance Improvement of Quantum Dot-Light-Emitting Diodes Enabled by an Alloyed ZnMgO Nanoparticle Electron Transport Layer," Chemistry of Materials, Dec. 9, 2014, pp. 197-204, vol. 27.

KR Office Action dated Dec. 8, 2021, of the corresponding Korean Patent Application No. 10-2017-0155034.

Yizhe Sun et al., "Efficient Quantum Dot Light-Emitting Diodes with Zn0.85Mg0.15O Interfacial Modification Layer," Nanoscale, May 5, 2017, pp. 1-19.

Office Action dated Nov. 3, 2022, of the corresponding Chinese Patent Application No. 201811275891.6.

Yizhe Sun et al., "Efficient quantum dot light-emitting diodes with a Zn0.85Mg0.15O interfacial modification layer," Nanoscale, May 5, 2017, pp. 8962-8969, vol. 9.

\* cited by examiner

QUANTUM DOT DEVICE AND DISPLAY DEVICE

CROSS-REFERENCE TO RELATED APPLICATION

This application is a continuation application of application Ser. No. 16/034,442, filed Jul. 13, 2018, which claims priority to and the benefit of Korean Patent Application No. 10-2017-0155034 filed in the Korean Intellectual Property Office on Nov. 20, 2017, and all the benefits accruing therefrom under 35 U.S.C. § 119, the entire content of which is incorporated herein by reference.

BACKGROUND

1. Field

A quantum dot device and a display device are disclosed.

2. Description of the Related Art

Unlike bulk materials, intrinsic physical characteristics (e.g., bandgap energy or melting point) of nanoparticles may be controlled by changing a size of the nanoparticle, unlike bulk materials.

For example, a semiconductor nanocrystal particle, also known as a quantum dot, when illuminated or supplied with electrical energy may emit light in a wavelength corresponding to a size of the quantum dot.

Accordingly, the quantum dot may be used as a light emitting element emitting light of a particular wavelength. Nonetheless, there remains a need for an improved quantum dot device.

SUMMARY

Recently, research on using the quantum dot as a light emitting element in a quantum dot device is being made.

However, the quantum dots are different than other light emitting elements, and a new method of improving performance of the quantum dot device is desired.

An embodiment provides a quantum dot device having improved performance.

An embodiment provides an electronic device including the quantum dot device.

According to an embodiment, a quantum dot device includes a first electrode and a second electrode facing each other; a quantum dot layer disposed between the first electrode and the second electrode; and an electron auxiliary layer disposed between the quantum dot layer and the second electrode and including a first nanoparticle and a second nanoparticle which is larger than the first nanoparticle, wherein a work function of the first electrode is greater than a work function of the second electrode, and a difference between a lowest unoccupied molecular orbital ("LUMO") energy level of the quantum dot layer and a lowest unoccupied molecular orbital energy level of the electron auxiliary layer is less than about 1.1 electronvolts (eV).

Each of the first nanoparticle and the second nanoparticle may include a zinc oxide.

The first nanoparticle may be represented by Chemical Formula 1 and the second nanoparticle may be ZnO.

$$Zn_{1-x}M_xO \quad \text{Chemical Formula 1}$$

In Chemical Formula 1,
M may be Mg, Ca, Zr, W, Li, Ti, or a combination thereof, and $0.01 \leq x < 0.5$.

The electron auxiliary layer may include a first electron auxiliary layer including the first nanoparticle and a second electron auxiliary layer including the second nanoparticle. The first electron auxiliary layer may be closer to the quantum dot layer than is the second electron auxiliary layer, and the second electron auxiliary layer may be closer to the second electrode than is the first electron auxiliary layer.

The first electron auxiliary layer may contact the quantum dot layer.

A difference between a LUMO energy level of the quantum dot layer and a LUMO energy level of the first electron auxiliary layer may be less than about 1.1 eV and a difference between a LUMO energy level of the first electron auxiliary layer and a LUMO energy level of the second electron auxiliary layer may be less than or equal to about 0.5 eV.

The LUMO energy level of the quantum dot layer may range from about 2.5 eV to about 3.6 eV, the LUMO energy level of the first electron auxiliary layer may range from about 3.2 eV to about 4 eV, and the LUMO energy level of the second electron auxiliary layer may range from about 3.9 eV to about 4.3 eV.

The electron auxiliary layer may be a mixed layer of the first nanoparticle and the second nanoparticle.

An average particle size of the first nanoparticle may be in a range from about 1.5 nanometers (nm) to about 3.3 nm and an average particle size of the second nanoparticle may be in a range from about 3.5 nm to about 5 nm.

A bandgap energy of the quantum dot layer may be in a range from about 2.4 eV to about 2.9 eV.

The quantum dot layer may include a quantum dot which does not include cadmium.

The quantum dot layer may include a blue light emitting quantum dot having a peak emission wavelength of less than or equal to about 470 nm.

The quantum dot may include zinc, tellurium, selenium, sulfur, indium, phosphorus, or a combination thereof.

The quantum dot may include zinc, tellurium, and selenium.

The quantum dot may include a core including zinc, tellurium, and selenium and a shell disposed on at least a part of the core, the shell having a different composition than that of the core.

The shell may include ZnSeS, ZnS, or a combination thereof.

The quantum dot may include indium, zinc, and phosphorus and a mole ratio of the zinc relative to the indium may be greater than or equal to about 25:1.

The quantum dot may include a core including indium, zinc, and phosphorus and a shell disposed on at least a part of the core, the shell having a different composition than that of the core.

The shell may include ZnSeS, ZnS, or a combination thereof.

A work function of the first electrode may be about 4.5 eV to about 5 eV and a work function of the second electrode may be greater than or equal to about 4 eV and less than about 4.5 eV.

The quantum dot device may further include a hole auxiliary layer between the first electrode and the quantum dot layer.

The hole auxiliary layer may include a hole injection layer between the first electrode and the quantum dot layer, and a hole transport layer between the hole injection layer and the quantum dot layer.

A quantum dot device includes a first electrode and a second electrode facing each other, wherein a work function of the first electrode is greater than a work function of the second electrode; a quantum dot layer between the first electrode and the second electrode, the quantum dot including zinc, tellurium, selenium, sulfur, or a combination thereof, the quantum dot including a core and a shell on at least a part of the core, the shell having a different composition than that of the core; and an electron auxiliary layer between the quantum dot layer and the second electrode, the electron auxiliary layer including a first nanoparticle including a compound represented by Chemical Formula 1 and a second nanoparticle including ZnO, $$Zn_{1-x}M_xO \qquad \text{Chemical Formula 1}$$

wherein, in Chemical Formula 1,
M is Mg, Ca, Zr, W, Li, Ti, or a combination thereof, and
$0.01 \leq x \leq 0.5$.

A method of forming a quantum dot device includes disposing a hole auxiliary layer on a first electrode; disposing a quantum dot layer on the hole auxiliary layer; disposing an electron auxiliary layer on the quantum dot layer, the electron auxiliary layer including a first nanoparticle and a second nanoparticle which is larger than the first nanoparticle; and disposing a second electrode on the electron auxiliary layer to provide the quantum dot device, wherein a work function of the first electrode is greater than a work function of the second electrode, and wherein a difference between a lowest unoccupied molecular orbital energy level of the quantum dot layer and a lowest unoccupied molecular orbital energy level of the electron auxiliary layer is less than about 1.1 electronvolts.

Disposing the electron auxiliary layer on the quantum dot layer may include disposing a first electron auxiliary layer comprising the first nanoparticle on the quantum dot layer, and disposing a second electron auxiliary layer comprising the second nanoparticle on the first electron auxiliary layer.

Disposing the quantum dot layer on the first electrode may include disposing a hole auxiliary layer on the first electrode, and disposing the quantum dot layer on the hole auxiliary layer.

Disposing the hole auxiliary layer on the first electrode may include disposing a hole injection layer on the first electrode, and disposing a hole transport layer on the hole injection layer.

According to an embodiment, a display device includes the quantum dot device.

Performance of the quantum dot device may be improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Hereinafter, example embodiments of the present disclosure will be described in further detail so that a person skilled in the art would understand the same.

This disclosure may, however, be embodied in many different forms and is not construed as limited to the example embodiments set forth herein.

In the drawings, the thickness of layers, films, panels, regions, etc., are exaggerated for clarity.

Like reference numerals designate like elements throughout the specification.

It will be understood that when an element such as a layer, film, region, or substrate is referred to as being "on" another element, it can be directly on the other element or intervening elements may also be present.

In contrast, when an element is referred to as being "directly on" another element, there are no intervening elements present.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function, a highest occupied molecular orbital ("HOMO") energy level or a lowest unoccupied molecular orbital (LUMO) energy level is expressed as an absolute value from a vacuum.

In addition, when the work function, HOMO energy level or LUMO energy level is said to be 'deep,' 'high' or 'large,' the work function, HOMO energy level or LUMO energy level has a large absolute value relative to '0 eV,' i.e., the energy level of a vacuum, while when the work function, HOMO energy level or LUMO energy level is said to be 'shallow,' 'low,' or 'small,' the work function, HOMO energy level or LUMO energy level has a small absolute value from '0 eV,' i.e., the energy level of a vacuum.

Hereinafter, a quantum dot device according to an embodiment is further described with reference to the drawings.

Figure 1:
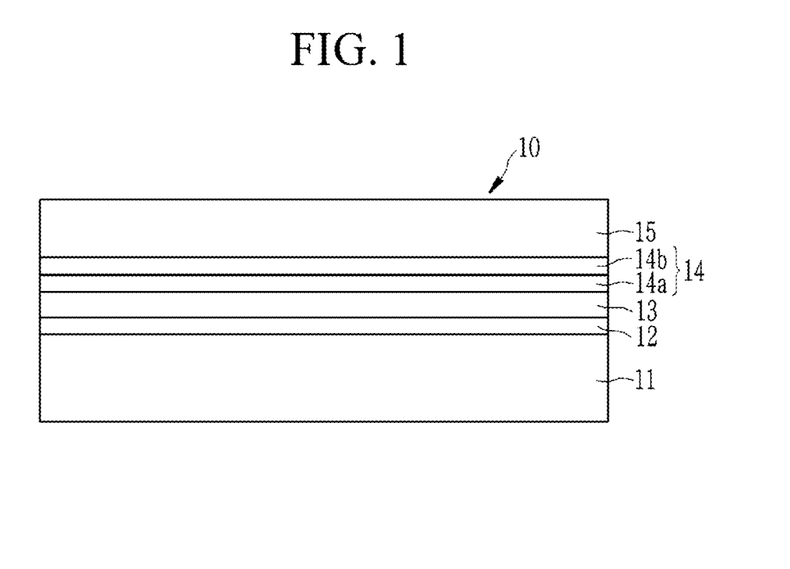
FIG. 1 is a schematic cross-sectional view of an embodiment of a quantum dot device.

FIG. 1 is a schematic cross-sectional view of an embodiment of a quantum dot device.

Referring to FIG. 1, a quantum dot device 10 according to an embodiment includes a first electrode 11 and a second electrode 15 facing each other, a quantum dot layer 13 disposed between the first electrode 11 and the second electrode 15, a hole auxiliary layer 12 disposed between the first electrode 11 and the quantum dot layer 13, and an electron auxiliary layer 14 disposed between the second electrode 15 and the quantum dot layer 13.

A substrate (not shown) may be disposed on a surface of the first electrode 11 or a surface of the second electrode 15.

The substrate may include, for example, an inorganic material such as glass; an organic material such as polycarbonate, polymethylmethacrylate, polyethyleneterephthalate, polyethylenenaphthalate, polyamide, polyethersulfone, or a combination thereof; or a silicon wafer. A combination including at least one of the foregoing may be used.

The substrate may be omitted.

One of the first electrode 11 and the second electrode 15 may be an anode and the other may be a cathode.

For example, the first electrode 11 may be an anode and the second electrode 15 may be a cathode.

The first electrode 11 may include a conductor having a high work function, and may be for example a metal, a conductive metal oxide, or a combination thereof. For example, the first electrode 11 may include a conductor having a work function that is greater than a work function of a conductor of the second electrode 15.

The first electrode 11 may include, for example, a metal or an alloy, and may include nickel, platinum, vanadium, chromium, copper, zinc, gold, or a combination thereof; a conductive metal oxide such as zinc oxide, indium oxide, tin oxide, indium tin oxide ("ITO"), indium zinc oxide ("IZO"), or a fluorine-doped tin oxide, or a combination thereof; or a combination of metal and oxide, such as ZnO and Al or $SnO_2$ and Sb, but is not limited thereto. Any suitable combination of the metal, alloy, and conductive metal oxide may be used.

The second electrode 15 may include, for example, a conductor having a low work function than the first electrode 11 and may include, for example, a metal, a conductive metal oxide, a conductive polymer, or a combination thereof. For example, the second electrode 15 may include a conductor having a work function that is less than a work function of a conductor of the second electrode 11.

The second electrode 15 may include, for example, a metal or an alloy, and may include aluminum, magnesium, calcium, sodium, potassium, titanium, indium, yttrium, lithium, gadolinium silver, tin, lead, cesium, barium, or a combination thereof; and may have a multi-layer structure, such as a structure including a first layer including an alkali metal halide, alkaline earth metal halide, an alkali metal oxide, or a combination thereof, and an a metal layer, wherein the metal layer includes an alkaline earth metal, a Group 13 metal, or a combination thereof. In an embodiment, the first layer of the multi-layer structure includes LiF, $BaF_2$, $LiO_2$, or a combination thereof, and the metal layer includes Al, Ca, or a combination thereof. Examples include LiF/Al, $LiO_2$/Al, 8-quinolinolato lithium (Liq)/Al, LiF/Ca, and $BaF_2$/Ca, but are not limited thereto.

The work function of the first electrode 11 may be greater than the work function of the second electrode 15 and the work function of the first electrode 11 may be for example about 4.5 eV to about 5 eV and the work function of the second electrode 15 may be for example greater than or equal to about 4 eV and less than about 4.5 eV. The work function of the first electrode 11 may be about 4.6 eV to about 4.9 eV, or about 4.7 eV to about 4.8 eV. Also, work function of the second electrode 15 may be about 4.1 eV to about 4.4 eV, or about 4.2 eV to about 4.3 eV.

In an embodiment, the work function of the first electrode 11 may be for example about 4.6 eV to about 4.9 eV and the work function of the second electrode 15 may be for example about 4 eV to about 4.3 eV.

At least one of the first electrode 11 and the second electrode 15 may be a light-transmitting electrode and the light-transmitting electrode may, for example, include a conductive oxide such as a zinc oxide, indium oxide, tin oxide, indium tin oxide ("ITO"), indium zinc oxide ("IZO"), or a fluorine doped tin oxide, and may be in a form of a single metal thin layer or a multilayer.

When one of the first electrode 11 and the second electrode 15 is a non-light-transmitting electrode, non-light-transmitting first or second electrode may include, for example, an opaque conductor such as aluminum (Al), silver (Ag), or gold (Au).

The quantum dot layer 13 includes a quantum dot.

The quantum dot may be a semiconductor nanocrystal, and may have been suitable shape, and may be, for example, an isotropic semiconductor nanocrystal, a quantum rod, a quantum plate, or a combination thereof.

Herein, the quantum rod may indicate a quantum dot having an aspect ratio of greater than about 1:1, for example an aspect ratio of greater than or equal to about 2:1, greater than or equal to about 3:1, or greater than or equal to about 5:1.

For example, the quantum rod may have an aspect ratio of less than or equal to about 50:1, of less than or equal to about 30:1, or of less than or equal to about 20:1.

The quantum dot may have for example a particle diameter (an average largest particle diameter for a non-spherical shape) of for example about 1 nanometer (nm) to about 100 nm, about 1 nm to about 80 nm, about 1 nm to about 50 nm, or about 1 nm to about 20 nm.

A bandgap energy of the quantum dot may be selected, e.g., controlled, according to a size and a composition of the quantum dot, and thus light emitting wavelength may be selected, e.g., controlled.

For example, as a size of the quantum dots increases, the quantum dots may have a narrower bandgap energy, and thus emit light having a relatively longer wavelength. Conversely, when the size of the quantum dots decreases, the quantum dots may have wider bandgap energy, and thus emit light having a relatively shorter wavelength.

For example, the quantum dot may emit having a predetermined, e.g., selected, wavelength of visible light based on its size, composition, or a combination thereof.

For example, the quantum dot may emit blue light, red light, or green light, and the blue light may have for example a peak emission wavelength of about 430 nm to about 470 nm, the red light may have for example a peak emission wavelength in a range of about 600 nm to about 650 nm, and the green light may have for example a peak emission wavelength of about 520 nm to about 550 nm.

For example, the quantum dot may emit blue light having a peak emission wavelength of about 430 nm to about 470 nm.

For example, an average size of the quantum dot emitting blue light may be less than or equal to about 4.5 nm, for example about 4.3 nm, less than or equal to about 4.2 nm, less than or equal to about 4.1 nm, or less than or equal to about 4.0 nm.

In an embodiment, an average size of the quantum dot emitting blue light may be about 2 nm to about 4.5 nm, for example about 2 nm to about 4.3 nm, about 2 nm to about 4.2 nm, about 2 nm to about 4.1 nm, or about 2 nm to about 4 nm, or about 2.1 nm to about 4.4 nm, about 2.2 nm to about 4.3 nm, or about 2.3 nm to about 4.2 nm.

The quantum dot may have for example a quantum yield of greater than or equal to about 10%, greater than or equal to about 30%, greater than or equal to about 50%, greater than or equal to about 60%, greater than or equal to about 70%, or greater than or equal to about 90%. For example, the quantum dot may have a quantum yield of greater than or equal to about 10% and less than about 95%, greater than or equal to about 30% and less than about 96%, greater than or equal to about 50% and less than about 97%, greater than or equal to about 60% and less than about 98%, greater than or equal to about 70% and less than about 99%, or greater than or equal to about 90% and less than about 100%.

The quantum dot may have a relatively narrow full width at half maximum ("FWHM").

Herein, the FWHM refers to a width of a peak at half of a peak absorption intensity, and as the FWHM is narrower, light in a narrower wavelength region may be emitted and improved color purity may be obtained.

The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm, and greater than or about 1 nm, greater than or equal to about 2 nm, greater than or equal to about 4 nm, greater than or equal to about 8 nm, or greater than or equal to about 16 nm.

For example, the quantum dot may include a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof.

The Group II-VI semiconductor compound may be for example a binary element compound, such as CdSe, CdTe, ZnS, ZnSe, ZnTe, ZnO, HgS, HgSe, HgTe, MgSe, MgS, or a combination thereof; a ternary element compound, such as CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; or a quaternary element compound, such as HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof, but is not limited thereto.

The Group III-V semiconductor compound may be for example a binary element compound, such as GaN, GaP, GaAs, GaSb, AlN, AlP, AlAs, AlSb, InN, InP, InAs, InSb, or a combination thereof; a ternary element compound, such as GaNP, GaNAs, GaNSb, GaPAs, GaPSb, AlNP, ALNAs, AlNSb, ALPAs, AlPSb, InNP, InNAs, InNSb, InPAs, InPSb, GaAlNP, or a combination thereof; or a quaternary element compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, but is not limited thereto.

The Group IV-VI semiconductor compound may be for example a binary element compound, such as SnS, SnSe, SnTe, PbS, PbSe, PbTe, or a combination thereof; a ternary element compound, such as SnSeS, SnSeTe, SnSTe, PbSeS, PbSeTe, PbSTe, SnPbS, SnPbSe, SnPbTe, or a combination thereof; or a quaternary element compound, such as SnPbSSe, SnPbSeTe, SnPbSTe, or a combination thereof, but is not limited thereto.

The Group IV semiconductor compound may be for example, a singular element semiconductor compound, such as Si, Ge, or a combination thereof; or a binary element semiconductor compound, such as SiC, SiGe, or a combination thereof, but is not limited thereto.

A combination including at least one of the foregoing semiconductor compounds may be used.

The Group semiconductor compound may be for example $CuInSe_2$, $CuInS_2$, CuInGaSe, CuInGaS, or a combination thereof, but is not limited thereto.

The Group I-II-IV-VI semiconductor compound may be for example CuZnSnSe and CuZnSnS, but is not limited thereto.

The Group II-III-V semiconductor compound may include for example InZnP, but is not limited thereto.

The quantum dot may include the binary semiconductor compound, the ternary semiconductor compound, or the quaternary semiconductor compound in a substantially uniform concentration, or in a manner having a concentration distribution or concentration gradient.

For example, the quantum dot may include a non-cadmium-based quantum dot.

Cadmium (Cd) may cause severe environment/health problems and a restricted element by Restriction of Hazardous Substances Directive ("RoHS") in a plurality of countries, and thus the non-cadmium-based quantum dot may be effectively used.

The quantum dot may include zinc, tellurium, selenium, sulfur, indium, phosphorus, or a combination thereof.

The quantum dot may include a semiconductor compound including zinc (Zn), tellurium (Te), and selenium (Se). For example, the quantum dot may be for example a semiconductor compound including zinc (Zn), tellurium (Te), and selenium (Se).

For example, in the semiconductor compound, a content of tellurium (Te) may be less than that of selenium (Se).

The semiconductor compound may emit blue light and have a peak emission wavelength in a wavelength region of less than or equal to about 470 nm, for example a wavelength region of about 430 nm to about 470 nm.

For example, the quantum dot may be for example a semiconductor compound including indium (In), zinc (Zn), and phosphorus (P).

For example, in the semiconductor compound, a mole ratio of the zinc relative to the indium (In) may be greater than or equal to about 25:1.

For example, the mole ratio of zinc (Zn) relative to indium (In) may be greater than or equal to about 28:1, greater than or equal to about 29:1, or greater than or equal to about 30:1.

For example, the mole ratio of zinc (Zn) relative to indium (In) may be less than or equal to about 55:1, for example less than or equal to about 50:1, less than or equal to about 45:1, less than or equal to about 40:1, less than or equal to about 35:1, less than or equal to about 34:1, less than or equal to about 33:1

The semiconductor compound may emit blue light having a peak emission wavelength in a wavelength region of less than or equal to about 470 nm, for example a wavelength region of about 430 nm to about 470 nm.

The quantum dot may have a core-shell structure wherein a first quantum dot is surrounded by a second quantum dot.

For example, the core and the shell of the quantum dot may have an interface, and an element of at least one of the core or the shell in the interface may have a concentration gradient wherein the concentration of the element(s) of the shell decreases toward the core.

For example, a material composition of the shell of the quantum dot has a greater bandgap energy than a material composition of the core of the quantum dot, and thereby the quantum dot may exhibit a quantum confinement effect.

The quantum dot may have a quantum dot core and a multi-layered quantum dot shell surrounding the core.

Herein, the multi-layered shell has at least two shells wherein each shell may be a single composition, may be an alloy, may have a concentration gradient, or a combination thereof.

For example, a shell of a multi-layered shell that is farther from the core may have a greater bandgap energy than a shell that is closer to the core, and thereby the quantum dot may exhibit a quantum confinement effect.

For example, the quantum dot having the core-shell structure may include a core including a first semiconductor compound including zinc (Zn), tellurium (Te), and selenium (Se), and a shell including a second semiconductor compound disposed on at least a part of the core and having a different composition than that of the core.

The Zn—Te—Se-based first semiconductor compound may be for example a Zn—Se-based semiconductor compound including a small amount of tellurium (Te) and, for example, a semiconductor compound represented by $ZnTe_xSe_{1-x}$ (wherein, x is greater than about 0 and less than or equal to about 0.05).

For example, in the Zn—Te—Se-based first semiconductor compound, the molar amount of zinc (Zn) may be greater than that of selenium (Se), and the molar amount of selenium (Se) may be greater than that of tellurium (Te).

For example, in the first semiconductor compound, a mole ratio of tellurium (Te) relative to selenium (Se) may be less than or equal to about 0.05, less than or equal to about 0.049, less than or equal to about 0.048, less than or equal to about 0.047, less than or equal to about 0.045, less than or equal to about 0.044, less than or equal to about 0.043, less than or equal to about 0.042, less than or equal to about 0.041, less than or equal to about 0.04, less than or equal to about 0.039, less than or equal to about 0.035, less than or equal to about 0.03, less than or equal to about 0.029, less than or equal to about 0.025, less than or equal to about 0.024, less than or equal to about 0.023, less than or equal to about 0.022, less than or equal to about 0.021, less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.01, and greater than or equal to 0, greater than or equal to 0.0001, greater than or equal to 0.001, or greater than or equal to 0.01.

For example, in the first semiconductor compound, a mole ratio of tellurium (Te) relative to zinc (Zn) may be less than or equal to about 0.02, less than or equal to about 0.019, less than or equal to about 0.018, less than or equal to about 0.017, less than or equal to about 0.016, less than or equal to about 0.015, less than or equal to about 0.014, less than or equal to about 0.013, less than or equal to about 0.012, less than or equal to about 0.011, or less than or equal to about 0.011, and greater than or equal to 0, greater than or equal to 0.0001, greater than or equal to 0.001, or greater than or equal to 0.01.

The second semiconductor compound may include for example a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof.

Examples of the Group II-VI semiconductor compound, the Group III-V semiconductor compound, the Group IV-VI semiconductor compound, the Group IV semiconductor compound, the Group semiconductor compound, the Group I-II-IV-VI semiconductor compound, and the Group II-III-V semiconductor compound are the same as described above.

For example, the second semiconductor compound may include zinc (Zn), selenium (Se), and/or sulfur (S).

For example, the shell may include at least one internal shell disposed closer to the core and an outermost shell disposed at the outermost shell of the quantum dot and the internal shell may include ZnSeS and the outermost shell may include ZnS.

For example, the shell may have a concentration gradient of a first component and for example an amount of sulfur (S) may increase in a direction away from the core.

For example, the quantum dot having the core-shell structure may include a core including a third semiconductor compound including indium (In), zinc (Zn), and phosphorus (P) and a shell including a fourth semiconductor compound disposed on at least a part of the core and having a different composition than that of the core.

In the In—Zn—P-based third semiconductor compound, a mole ratio of zinc (Zn) relative to indium (In) may be greater than or equal to about 25.

For example, in the In—Zn—P-based third semiconductor compound, the mole ratio of zinc (Zn) relative to indium (In) may be greater than or equal to about 28, greater than or equal to about 29, or greater than or equal to about 30.

For example, in the In—Zn—P-based third semiconductor compound, the mole ratio of zinc (Zn) relative to indium (In) may be less than or equal to about 55, for example less than or equal to about 50, less than or equal to about 45, less than or equal to about 40, less than or equal to about 35, less than or equal to about 34, less than or equal to about 33, or less than or equal to about 32.

The fourth semiconductor compound may for example include a Group II-VI semiconductor compound, a Group III-V semiconductor compound, a Group IV-VI semiconductor compound, a Group IV semiconductor compound, a Group semiconductor compound, a Group I-II-IV-VI semiconductor compound, a Group II-III-V semiconductor compound, or a combination thereof.

Examples of the Group II-VI semiconductor compound, Group III-V semiconductor compound, Group IV-VI semiconductor compound, Group IV semiconductor compound, Group semiconductor compound, Group I-II-IV-VI semiconductor compound, and Group II-III-V semiconductor compound are the same as described above.

For example, the fourth semiconductor compound may include zinc (Zn) and sulfur (S) and optionally selenium (Se).

For example, the shell may include at least one internal shell disposed closer to the core and an outermost shell disposed at the outermost shell of the quantum dot and the at least one of the internal shell and the outermost shell may include a fourth semiconductor compound including ZnS or ZnSeS.

The quantum dot layer 13 may have for example a thickness of about 5 nm to about 200 nm, for example about 10 nm to about 150 nm, for example about 10 nm to about 100 nm, or about 10 nm to about 50 nm.

The quantum dot layer 13 may have for example a relatively high HOMO energy level, for example a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6 eV.

The HOMO energy level of the quantum dot layer 13 may be for example about 5.4 eV to about 7 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, for example about 5.6 eV to about 7 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, for example about 5.7 eV to about 7 eV, about 5.7 eV to about 6.8 eV, about 5.7 eV to about 6.5 eV, about 5.7 eV to about 6.3 eV, about 5.7 eV to about 6.2 eV, about 5.7 eV to about 6.1 eV, for example about 5.8 eV to about 7 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, or for example about 6 eV to about 7 eV, about 6 eV to about 6.8 eV, about 6 eV to about 6.7 eV, about 6 eV to about 6.5 eV, about 6 eV to about 6.3 eV, or about 6 eV to about 6.2 eV.

The quantum dot layer 13 may have a relatively low LUMO energy level, for example an LUMO energy level of less than or equal to about 3.6 eV, for example less than or equal to about 3.5 eV, less than or equal to about 3.4 eV, less than or equal to about 3.3 eV, less than or equal to about 3.2 eV, or less than or equal to about 3 eV.

The LUMO energy level of the quantum dot layer 13 may be for example about 2.5 eV to about 3.6 eV, about 2.5 eV to about 3.5 eV, about 2.5 eV to about 3.4 eV, about 2.5 eV to about 3.3 eV, about 2.5 eV to about 3.2 eV, about 2.5 eV to about 3.1 eV, or about 2.5 eV to about 3 eV.

The quantum dot layer 13 may have a bandgap energy of about 2.4 eV to about 2.9 eV.

In an embodiment, the quantum dot layer 13 may have a bandgap energy of about 2.4 eV to about 2.8 eV, for example about 2.4 eV to about 2.78 eV.

The hole auxiliary layer 12 is disposed between the first electrode 11 and the quantum dot layer 13.

The hole auxiliary layer 12 may include any suitable number of layers, e.g., about 1 to about 20 layers, about 2 to about 10 layers, or about 3 to about 5 layers, for example, a single layer or two or more layers and may include for example a hole injection layer, a hole transport layer, an electron blocking layer, or a combination thereof.

The hole auxiliary layer 12 may have a relatively high HOMO energy level so that the hole auxiliary layer 12 may match a HOMO energy level of the quantum dot layer 13.

Accordingly, mobility of holes transported from the hole auxiliary layer 12 to the quantum dot layer 13 may be increased.

The HOMO energy level of the hole auxiliary layer 12 may be the same as or less than the HOMO energy level of the quantum dot layer 13 within a range of less than or equal to about 1 eV.

For example, a difference of HOMO energy levels between the hole auxiliary layer 12 and the quantum dot layer 13 may be about 0 eV to about 1 eV, for example about 0.01 eV to about 0.8 eV, about 0.01 eV to about 0.7 eV, about 0.01 eV to about 0.5 eV, about 0.01 eV to about 0.4 eV, about 0.01 eV to about 0.3 eV, about 0.01 eV to about 0.2 eV, or about 0.01 eV to about 0.1 eV.

The HOMO energy level of the hole auxiliary layer 12 may be for example greater than or equal to about 5 eV, for example greater than or equal to about 5.2 eV, greater than or equal to about 5.4 eV, greater than or equal to about 5.6 eV, or greater than or equal to about 5.8 eV.

For example, the HOMO energy level of the hole auxiliary layer 12 may be about 5 eV to about 7 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

Figure 6:
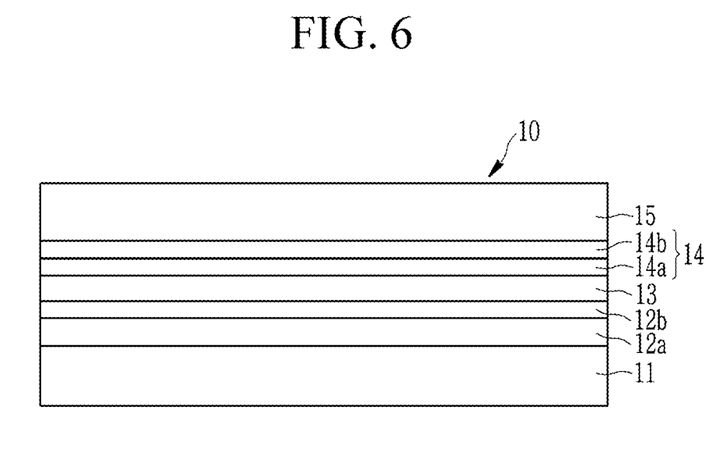
FIG. 6 is a schematic cross-sectional view of an embodiment of a quantum dot device.
Figure 7:
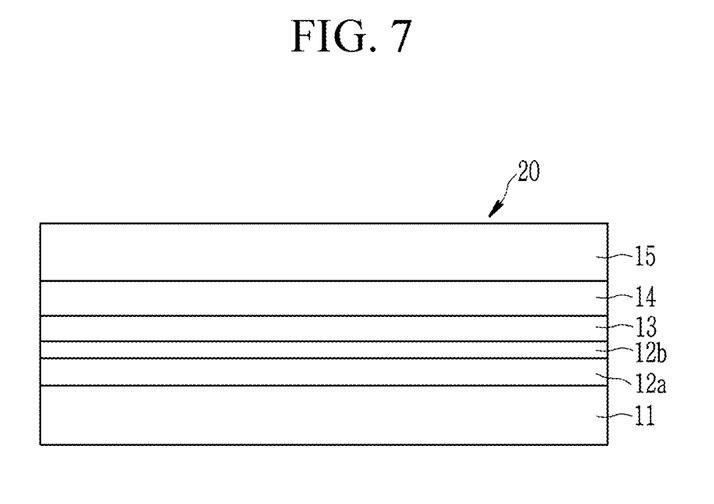
FIG. 7 is a schematic cross-sectional view of another embodiment of a quantum dot device.

For example, as shown in FIG. 6 and FIG. 7, the hole auxiliary layer 12 may include a hole injection layer 12a closer the first electrode 11, and a hole transport layer 12b closer the quantum dot layer 13. The hole injection layer 12a may be between the first electrode 11 and the hole transport layer 12b, and the hole transport layer 12b may be between the hole injection layer 12a and the quantum dot layer 13. The hole injection layer 12a may be adjacent to the first electrode 11, and the hole transport layer 12b may be adjacent to the quantum dot layer 13. The quantum dot device 20 shown in FIG. 7 differs from that shown in FIG. 6 in that in the device of FIG. 7 a single electron auxiliary layer 14 is used, whereas the device of FIG. 6 includes a first electron auxiliary layer 14a separated from the second electron auxiliary layer 14b.

Herein, the HOMO energy level of the hole injection layer 12a may be about 5 eV to about 6 eV, for example about 5 eV to about 5.5 eV, or about 5 eV to about 5.4 eV and the HOMO energy level of the hole transport layer 12b may be about 5.2 eV to about 7 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, or about 5.4 eV to about 6.1 eV.

The hole auxiliary layer 12 may be particularly not limited as long as a material satisfies the energy level, and may include for example at least one of poly(9,9-dioctyl-fluorene-co-N-(4-butylphenyl)-diphenylamine ("TFB"), polyarylamine, poly(N-vinylcarbazole, poly(3,4-ethylenedi-oxythiophene ("PEDOT"), poly(3,4-ethylenedioxythio-phene)polystyrene sulfonate ("PEDOT:PSS"), polyaniline, polypyrrole, N,N,N',N'-tetrakis(4-methoxyphenyl)-benzi-dine ("TPD"), 4-bis[N-(1-naphthyl)-N-phenyl-amino]bi-phenyl ("α-NPD"), 4,4',4"-tris[phenyl(m-tolyl)amino]triph-enylamine ("m-MTDATA"), 4,4',4"-tris(N-carbazolyl)-triphenylamine ("TCTA"), 1,1-bis[(di-4-tolylamino) phenyl cyclohexane ("TAPC"), p-type metal oxide (e.g., NiO, WO₃, or MoO₃), a carbon-based material such as graphene oxide, or a combination thereof, but is not limited thereto.

The electron auxiliary layer 14 is disposed between the quantum dot layer 13 and the second electrode 15 and includes a first electron auxiliary layer 14a that is closer to the quantum dot layer 13 than is a second electron auxiliary layer 14b. The second electron auxiliary layer 14b is closer to the second electrode 15 than is the first electron auxiliary layer 14a. For example, the first electron auxiliary layer 14a may be between the quantum dot layer 13 and the second electron auxiliary layer 14b, and the second electron auxiliary layer 14b may be between the first electron auxiliary layer 14a and the second electrode 15. For example, the first electron auxiliary layer 14a may be adjacent to the quantum dot layer 13, and the second electron auxiliary layer 14b may be adjacent to the second electrode 15.

For example, the first electron auxiliary layer 14a may contact the quantum dot layer 13 and the second electron auxiliary layer 14b may contact the second electrode 15.

The electron auxiliary layer 14 may include for example an electron injection layer, an electron transport layer, a hole blocking layer, or a combination thereof, but is not limited thereto. The first electron auxiliary layer 14a may be an electron injection layer, and the second electron auxiliary layer 14b may be an electron transport layer.

The first electron auxiliary layer 14a and the second electron auxiliary layer 14b may independently include an inorganic material, an organic material, or a combination thereof, for example an inorganic material, for example an inorganic nanoparticle.

For example, the inorganic nanoparticle included in the first electron auxiliary layer 14a and the second electron auxiliary layer 14b may include for example a metal oxide, respectively.

For example, the first electron auxiliary layer 14a may include a first nanoparticle including a metal oxide and the second electron auxiliary layer 14b may include a second nanoparticle including a metal oxide.

For example, in an ultraviolet (UV) absorption spectrum, a first exciton peak wavelength of the first nanoparticle may be shorter than a first exciton peak wavelength of the second nanoparticle, and thus a bandgap energy of the first electron auxiliary layer 14a including the first nanoparticle may be larger than the bandgap energy of the second electron auxiliary layer 14b including the second nanoparticle.

For example, the first nanoparticle included in the first electron auxiliary layer 14a and the second nanoparticle included in the second electron auxiliary layer 14b may have a different particle size and an average particle size of the second nanoparticle included in the second electron auxiliary layer 14b may be larger than an average particle size of the first nanoparticle included in the first electron auxiliary layer 14a.

The average particle size of the first nanoparticle included in the first electron auxiliary layer 14a may be less than about 3.5 nm, for example less than or equal to about 3.4 nm, less than or equal to about 3.3 nm, less than or equal to about 3.2 nm, less than or equal to about 3.1 nm, or less than or equal to about 3 nm.

The average particle size of the first nanoparticle may be for example greater than or equal to about 1.2 nm and less than about 3.5 nm, greater than or equal to about 1.3 nm and less than about 3.4 nm, about 1.5 nm to about 3.3 nm, about 1.8 nm to about 3.3 nm, or about 2 nm to about 3.3 nm.

The average particle size of the second nanoparticle included in the second electron auxiliary layer 14b may be larger than the average particle size of the first nanoparticle and may be for example greater than or equal to about 3.5 nm.

The average particle size of the second nanoparticle may be for example about 3.5 nm to about 7 nm, about 3.5 nm to about 6 nm, about 3.5 nm to about 5.5 nm, about 3.5 nm to about 5 nm, about 4 nm to about 5 nm, or about 4.5 nm to about 5 nm.

For example, the bandgap energy of the first nanoparticle included in the first electron auxiliary layer 14a may be larger than the bandgap energy of the second nanoparticle included in the second electron auxiliary layer 14b.

For example, the bandgap energy of the first nanoparticle may be about 3.55 eV to about 3.65 eV and the bandgap energy of the second nanoparticle may be greater than or equal to about 3.4 eV and less than about 3.55 eV.

For example, the first nanoparticle and the second nanoparticle may be a zinc (Zn)-containing oxide.

For example, the first nanoparticle may be an oxide including zinc (Zn) and a metal or semi-metal except zinc (Zn) and the second nanoparticle may be a zinc oxide (ZnO).

For example, the first nanoparticle may be represented by Chemical Formula 1 and the second nanoparticle may be ZnO.

$$Zn_{1-x}M_xO \qquad \text{Chemical Formula 1}$$

In Chemical Formula 1,

M is Mg, Ca, Zr, W, Li, Ti, or a combination thereof, and $0.01 \leq x < 0.5$.

For example, in Chemical Formula 1, M may be magnesium (Mg).

For example, in Chemical Formula 1, x may satisfy $0.01 \leq x \leq 0.3$, for example $0.01 \leq x \leq 0.15$.

A LUMO energy level of the first electron auxiliary layer 14a may be less than a LUMO energy level of the second electron auxiliary layer 14b.

For example, the LUMO energy level of the first electron auxiliary layer 14a may be about 3.2 eV to about 4 eV, for example about 3.4 eV to about 4 eV, or about 3.6 eV to about 4 eV.

For example, the LUMO energy level of the second electron auxiliary layer 14b may be about 3.9 eV to about 4.3 eV, for example about 4 eV to about 4.3 eV, or about 4 eV to about 4.2 eV.

The LUMO energy level of the first electron auxiliary layer 14a may be between the LUMO energy level of the quantum dot layer 13 and the LUMO energy level of the second electron auxiliary layer 14b, but is not limited thereto.

The LUMO energy level of the first electron auxiliary layer 14a may be greater or less than the LUMO energy level of the quantum dot layer 13 and a difference between LUMO energy levels of the quantum dot layer 13 and the first electron auxiliary layer 14a may be less than about 1.1 eV, for example less than or equal to about 1 eV, less than or equal to about 0.9 eV, or less than or equal to about 0.85 eV.

The LUMO energy level of the first electron auxiliary layer 14a may be less than the LUMO energy level of the second electron auxiliary layer 14b and a difference between the LUMO energy levels of the first electron auxiliary layer 14a and the second electron auxiliary layer 14b may be for example less than or equal to about 0.5 eV, less than or equal to about 0.4 eV, or less than or equal to about 0.3 eV.

For example, the LUMO energy level of the quantum dot layer 13 may be about 2.5 eV to about 3.6 eV, the LUMO energy level of the first electron auxiliary layer 14a may be about 3.2 eV to about 4 eV, and the LUMO energy level of the second electron auxiliary layer 14b may be about 3.9 eV to about 4.3 eV.

In this way, efficiency of the quantum dot device may be improved by including the first electron auxiliary layer 14a and the second electron auxiliary layer 14b between the quantum dot layer 13 and the second electrode 15 and thus reducing an energy barrier due to the difference of LUMO energy levels between the second electrode 15 and the quantum dot layer 13 to easily inject and transport electrons.

Particularly, unlike a cadmium-based blue quantum dot device, and/or a red or green quantum dot device, the first electron auxiliary layer 14a and the second electron auxiliary layer 14b may be effectively applied to a blue light emitting cadmium-free quantum dot device including the quantum dot layer 13 having a relatively low LUMO energy level.

In addition, and while not wanting to be bound by theory, it is understood that a leakage current may be effectively reduced by including the first and second electron auxiliary layers 14a and 14b including nanoparticles having a different particle size to form a dense film on the interface between the first electron auxiliary layer 14a and the second electron auxiliary layer 14b, between the quantum dot layer 13 and the first electron auxiliary layer 14a, or a combination thereof.

Figure 2:
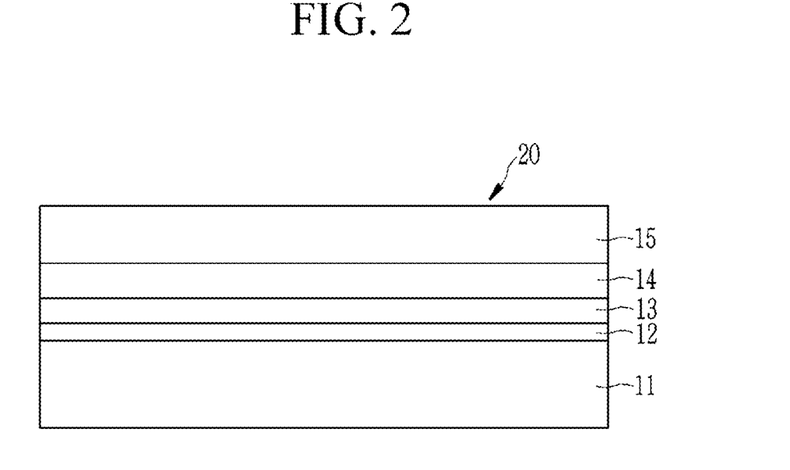
FIG. 2 is a schematic cross-sectional view of another embodiment of a quantum dot device.

FIG. 2 is a schematic cross-sectional view showing a quantum dot device according to another embodiment.

Referring to FIG. 2, a quantum dot device 20 according to an embodiment includes a first electrode 11, a hole auxiliary layer 12, a quantum dot layer 13, an electron auxiliary layer 14, and a second electrode 15 like the above embodiment.

The first electrode 11, the hole auxiliary layer 12, the quantum dot layer 13, and the second electrode 15 are the same as described above.

As shown in FIG. 2, the quantum dot device 20 includes a single electron auxiliary layer 14. The quantum dot device 20 shown in FIG. 2 differs from that shown in FIG. 1 in that in the device of FIG. 2 a single electron auxiliary layer 14 is used, whereas the device of FIG. 1 includes a first electron auxiliary layer 14a separated from the second electron auxiliary layer 14b.

For example, a first surface of the electron auxiliary layer 14 may contact the quantum dot layer 13, while an opposite second surface of the electron auxiliary layer 14 may contact the second electrode 15.

The electron auxiliary layer 14 may be for example an electron injection layer ("EIL"), an electron transport layer ("ETL"), a hole blocking layer, or a combination thereof, but is not limited thereto.

The electron auxiliary layer 14 may include an inorganic material, an organic material, or a combination thereof, for example an inorganic material, for example an inorganic nanoparticle, for example a nanoparticle including a metal oxide.

The electron auxiliary layer 14 may include a plurality of nanoparticles having a different energy level and a particle size, for example a first nanoparticle and a second nanoparticle.

For example, the first nanoparticle and the second nanoparticle may be present, e.g., mixed, in the electron auxiliary layer 14, e.g., the first nanoparticle and the second nanoparticle are not separated from one another in different layers.

Herein, the first nanoparticle and the second nanoparticle may be present, e.g., mixed, in a weight ratio of about 1:9 to about 9:1, for example about 2:8 to about 8:2, about 3:7 to about 7:3, about 4:6 to about 6:4, or about 5:5.

For example, in a UV absorption spectrum, a first exciton peak wavelength of the first nanoparticle may be shorter than a first exciton peak wavelength of the second nanoparticle.

For example, the first nanoparticle and the second nanoparticle may have a different particle size and the average particle size of the second nanoparticle may be greater than the average particle size of the first nanoparticle.

The average particle size of the first nanoparticle may be less than about 3.5 nm, for example less than or equal to about 3.4 nm, less than or equal to about 3.3 nm, less than or equal to about 3.2 nm, less than or equal to about 3.1 nm, or less than or equal to about 3 nm.

The average particle size of the first nanoparticle may be for example greater than or equal to about 1.2 nm and less than about 3.5 nm, greater than or equal to about 1.3 nm and less than about 3.4 nm, about 1.5 nm to about 3.3 nm, about 1.8 nm to about 3.3 nm, or about 2 nm to about 3.3 nm.

The average particle size of the second nanoparticle may be larger than the average particle size of the first nanoparticle and may be for example greater than or equal to about 3.5 nm.

The average particle size of the second nanoparticle may be for example about 3.5 nm to about 7 nm, about 3.5 nm to about 6 nm, about 3.5 nm to about 5.5 nm, about 3.5 nm to about 5 nm, about 4 nm to about 5 nm, or about 4.5 nm to about 5 nm.

For example, the first nanoparticle and the second nanoparticle may be a zinc (Zn)-containing oxide and for example the first nanoparticle may be represented by Chemical Formula 1 and the second nanoparticle may be ZnO.

$Zn_{1-x}M_xO$     Chemical Formula 1

In Chemical Formula 1,
M is Mg, Ca, Zr, W, Li, Ti, or a combination thereof, and $0.01 \le x < 0.5$.

For example, in Chemical Formula 1, M may be magnesium (Mg).

For example, in Chemical Formula 1, x may satisfy $0.01 \le x \le 0.3$, for example $0.01 \le x \le 0.15$.

The LUMO energy level of the electron auxiliary layer 14 may be greater or less than the LUMO energy level of the quantum dot layer 13 and a difference between LUMO energy levels of the quantum dot layer 13 and the electron auxiliary layer 14 may be less than about 1.1 eV.

The difference between LUMO energy levels of the quantum dot layer 13 and the electron auxiliary layer 14 may be for example less than or equal to about 1 eV, less than or equal to about 0.9 eV, or less than or equal to about 0.85 eV.

For example, the LUMO energy level of the quantum dot layer 13 may be about 2.5 eV to about 3.6 eV and the LUMO energy level of the electron auxiliary layer 14 may be about 3.2 eV to about 4.3 eV.

In this way, efficiency of the quantum dot device may be improved by including the electron auxiliary layer 14 including a plurality of nanoparticle having a different energy level and particle size between the quantum dot layer 13 and the second electrode 15 and thus easily injecting and transporting electrons from the second electrode 15 to the quantum dot layer 13.

Particularly, unlike a cadmium-based blue quantum dot device and/or a red or green quantum dot device, the electron auxiliary layer 14 may be effectively applied to a blue light emitting cadmium-free quantum dot device including the quantum dot layer 13 having a relatively low LUMO energy level.

In addition, a leakage current may be effectively decreased by including a plurality of nanoparticles having a different particle size in the electron auxiliary layer 14 and thus effectively reducing voids among the particle sizes in the electron auxiliary layer 14.

The hole auxiliary layer 12, the quantum dot layer 13, and the electron auxiliary layer 14 may be for example formed with a solution process, for example a spin coating, a slit coating, an inkjet printing, a nozzle printing, a spraying, a doctor blade coating, or a combination thereof, but is not limited thereto.

The quantum dot device may be for example applied to various electronic devices such as display devices or lighting devices, and the like.

Hereinafter, the embodiments are illustrated in more detail with reference to examples. However, these examples are exemplary, and the present disclosure is not limited thereto.

EXAMPLES

Synthesis Examples

Synthesis Example 1: Synthesis of ZnTeSe Core

Selenium (Se) and tellurium (Te) are respectively dispersed in trioctylphosphine ("TOP") to prepare a 2 molar (M) Se/TOP stock solution and a 0.1 M Te/TOP stock solution. 0.125 millimoles (mmol) of zinc acetate along with 0.25 mmol of oleic acid and 0.25 mmol of hexadecyl amine, and 10 milliliters (mL) of trioctylamine is put in a reactor, and the reactor is heated at 120° C. under vacuum. One hour later, an atmosphere in the reactor is converted into nitrogen. After heating the reactor at 300° C., the Se/TOP stock solution and the Te/TOP stock solution in a Te/Se ratio of 1/25 is rapidly injected thereinto. Subsequently, acetone is added to the reaction solution rapidly cooled down to room temperature after 10 minutes, 30 minutes, or 60 minutes, and a precipitate centrifuged therefrom is dispersed in toluene to obtain a ZnTeSe quantum dot.

Synthesis Example 2: Synthesis of Quantum Dot of ZnTeSe Core/ZnSeS Shell 1.8 mmol (0.336 grams (g)) of zinc acetate, 3.6 mmol (1.134 g) of oleic acid, and 10 mL of trioctylamine are put in a flask and then, vacuum-treated at 120° C. for 10 minutes. Nitrogen ($N_2$) is used to substitute an internal atmosphere of the flask, and the flask is heated to 180° C. The ZnTeSe core according to Synthesis Example 1 is added thereto within 10 seconds, subsequently, 0.04 mmol of Se/TOP is slowly injected thereinto, and the mixture is heated to 280° C. Then, 0.01 mmol of S/TOP is added thereto, and the obtained mixture is heated to 320° C. and reacted for 10 minutes. Subsequently, a mixed solution of 0.02 mmol of Se/TOP and 0.04 mmol of S/TOP is slowly injected thereinto, and the obtained mixture is reacted for 20 minutes again. Then, when a step of injecting a mixed solution by changing a mixing ratio of Se and S and reacting the obtained mixture for 20 minutes is repeated, the mixed solution of Se and S is a mixed solution of 0.01 mmol of Se/TOP and 0.05 mmol of S/TOP, a mixed solution of 0.005 mmol of Se/TOP and 0.1 mmol of S/TOP, and 0.5 mmol of a S/TOP solution, which are sequentially used. When the reaction is all complete, the reactor is cooled down, and nanocrystal produced therein is centrifuged with ethanol and dispersed in toluene to obtain a ZnTeSe/ZnSeS core-shell quantum dot.

Figure 3:
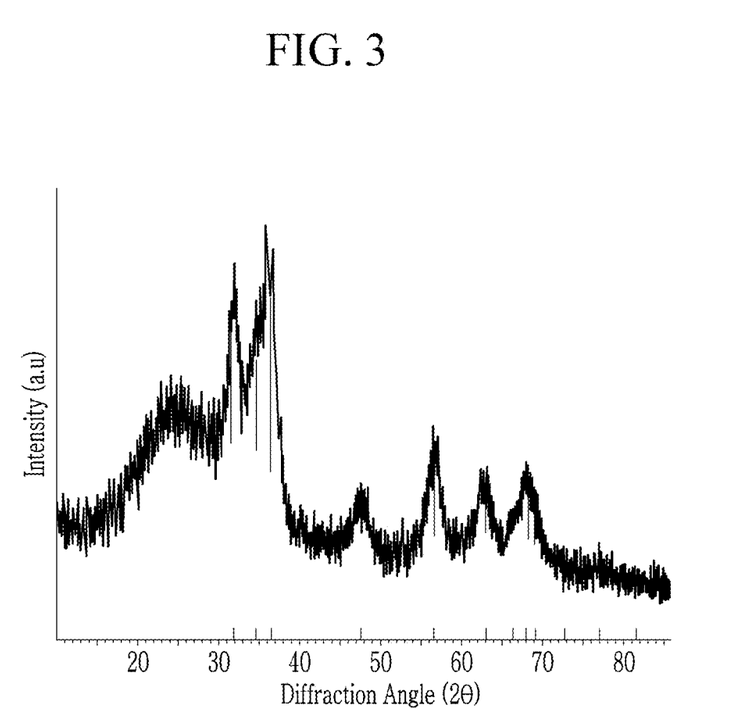
FIG. 3 is a graph of intensity (arbitrary units, a.u.) versus diffraction angle (degrees two-theta, 2θ) showing the results of X-ray diffraction (XRD) analysis of the $Zn_{0.85}Mg_{0.15}O$ nanoparticle of Synthesis Example 3.
Figure 4:
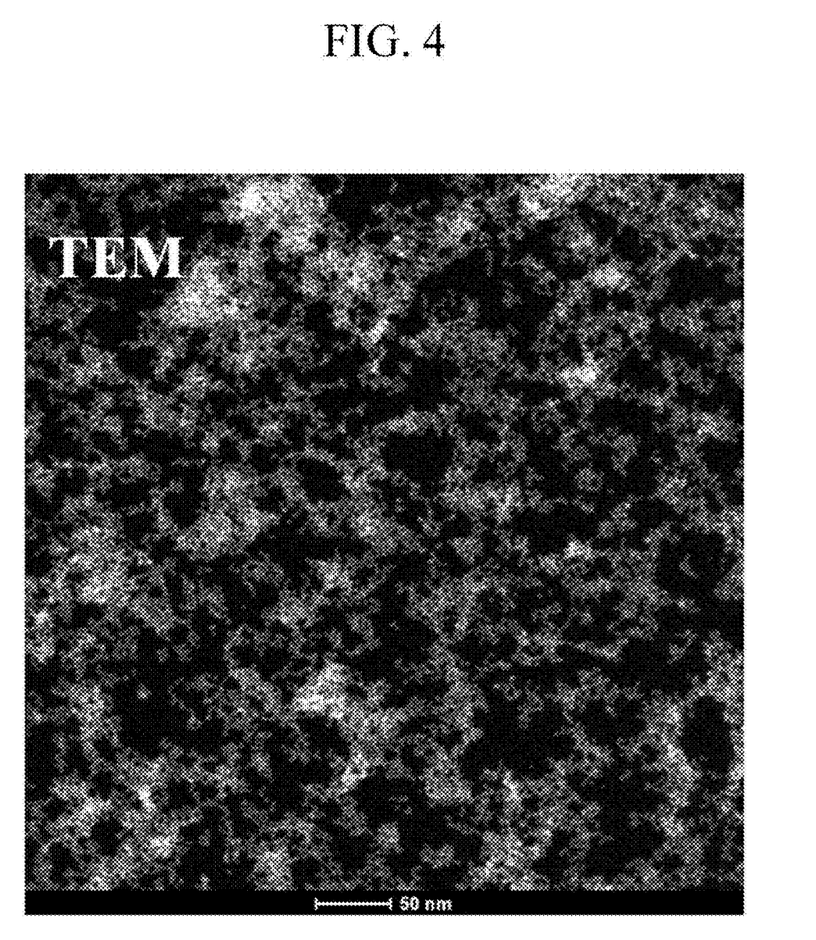
FIG. 4 is a transmission electron microscope ("TEM") photograph of the $Zn_{0.85}Mg_{0.15}O$ nanoparticle of Synthesis Example 3.

Synthesis Example 3: Synthesis of $Zn_{0.85}Mg_{0.15}O$ Nanoparticle 8.07 mmol of zinc acetate dihydrate, 0.93 mmol of magnesium acetate tetrahydrate, and 90 mL of dimethyl-sulfoxide are put in a reactor and heated at 60° C. in the air. Subsequently, 15 mmol of tetramethylammonium hydroxide pentahydrate is dissolved in 30 mL of ethanol, and the obtained solution is added in a dropwise fashion by 3 mL per one minute. After stirring the mixture for 1 hour, the obtained $Zn_{0.85}Mg_{0.15}O$ nanoparticles is centrifuged with ethyl acetate in a volume ratio of 1:9 and then, dispersed in ethanol to obtain $Zn_{0.85}Mg_{0.15}O$ nanoparticles. The obtained $Zn_{0.85}Mg_{0.15}O$ nanoparticles are XRD-analyzed with power 3 kilowatts (kVV) by using Philips X'Pert PRO to examine a crystal structure of the $Zn_{0.85}Mg_{0.15}O$ nanocrystals. FIG. 3 is an XRD graph of the $Zn_{0.85}Mg_{0.15}O$ nanoparticles of Synthesis Example 3, and FIG. 4 is a transmission electron microscope ("TEM") photograph showing the $Zn_{0.85}Mg_{0.15}O$ nanoparticles of Synthesis Example 3.

The $Zn_{0.85}Mg_{0.15}O$ nanoparticles have an average particle diameter size of about 3.0 nm when measured with a UT F30 Tecnai electron microscope.

Synthesis Example 4: Synthesis of $Zn_{0.9}Mg_{0.1}O$ Nanoparticle $Zn_{0.9}Mg_{0.1}O$ nanoparticles are obtained according to the same method as Synthesis Example 3 except for using 8.55 mmol of zinc acetate dehydrate and 0.45 mmol of magnesium acetate tetrahydrate. The $Zn_{0.9}Mg_{0.1}O$ nanoparticles have an average particle diameter size of 2.5 nm when measured with Philips X'Pert PRO.

Synthesis Example 5: Synthesis of $Zn_{0.95}Mg_{0.05}O$ Nanoparticle $Zn_{0.95}Mg_{0.05}O$ nanoparticles are obtained according to the same method as Synthesis Example 3 except for using 8.75 mmol of zinc acetate dehydrate and 0.25 mmol of magnesium acetate tetrahydrate. The $Zn_{0.9}Mg_{0.1}O$ nanoparticles have an average particle diameter size of 2.35 nm when measured with Philips X'Pert PRO.

Figure 5:
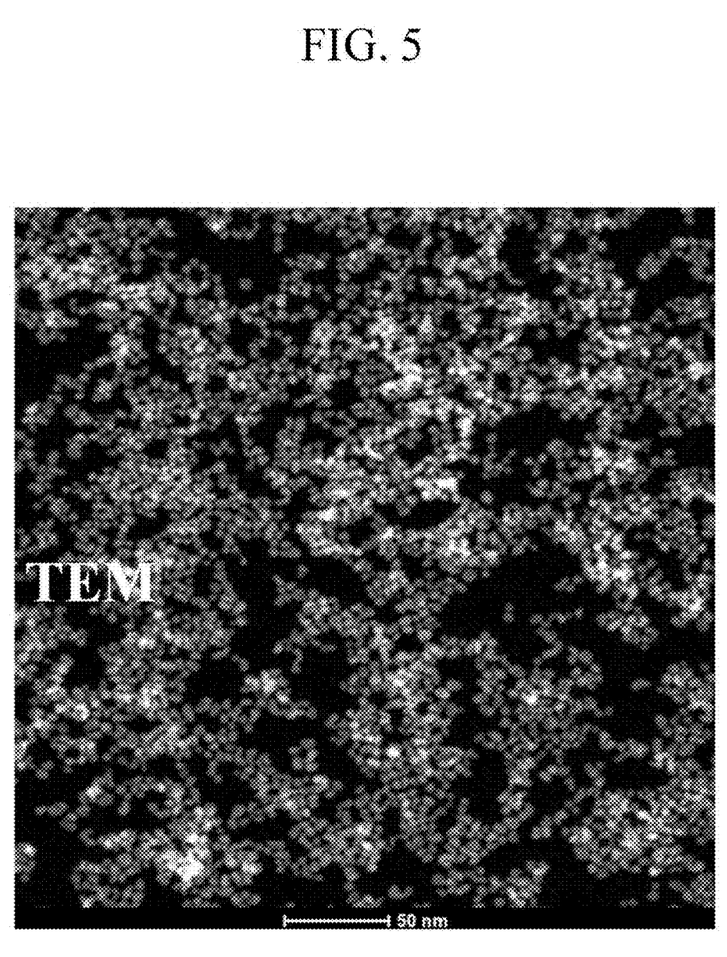
FIG. 5 is a TEM photograph of the ZnO nanoparticle of Synthesis Example 6.

Synthesis Example 6: Synthesis of ZnO 9.00 mmol of zinc acetate dihydrate and 90 mL of dimethylsulfoxide are put in a reactor and heated at 60° C. in the air. Subsequently, 15 mmol of tetramethylammonium hydroxide pentahydrate is dissolved in 30 mL of ethanol, and the obtained solution is added thereto in a dropwise fashion by 3 mL per one minute. After stirring the mixture for 1 hour, the obtained ZnO nanoparticles are centrifuged along with ethyl acetate in a volume ratio of 1:9 and dispersed in ethanol to obtain ZnO nanoparticles. FIG. 5 is a TEM photograph showing the ZnO nanoparticles of Synthesis Example 6. The $Zn_{0.95}Mg_{0.05}O$ nanoparticles have an average particle diameter size of 4.0 nm when measured with an UT F30 Tecnai electron microscope.

Evaluation I

Bandgap energies of the nanoparticles according to Synthesis Examples 3 to 6 are examined. The bandgap energies are measured and examined by UV band edge tangent (UV-2600, Shimadzu Corp.).

The results are shown in Table 1.

TABLE 1

| | Bandgap energy (eV) |
|---|---|
| Synthesis Example 3 ($Zn_{0.85}Mg_{0.15}O$) | 3.62 eV |
| Synthesis Example 4 ($Zn_{0.9}Mg_{0.1}O$) | 3.60 eV |
| Synthesis Example 5 ($Zn_{0.95}Mg_{0.05}O$) | 3.58 eV |
| Synthesis Example 6 (ZnO) | 3.52 eV |

Manufacture of Quantum Dot Device

Example 1

A 25 nm-thick hole injection layer (HOMO: 5.3 eV, LUMO: 2.7 eV) is formed by surface-treating a glass substrate on which ITO (work function (WF): 4.8 eV) is deposited with UV-ozone for 15 minutes, spin-coating a PEDOT:PSS solution (H.C. Starks) thereon, and heat-treating the glass substrate coated with a PEDOT:PSS solution under an air atmosphere at 150 for 10 minutes and in addition, under a $N_2$ atmosphere at 150° C. for 10 minutes. Subsequently, on the hole injection layer, a 25 nm-thick hole transport layer (HOMO: 5.6 eV, LUMO: 2.69 eV) is formed by spin-coating a poly[(9,9-dioctylfluorenyl-2,7-diyl-co(4, 4'-(N-4-butylphenyl)diphenylamine] solution ("TFB") (Sumitomo Corp.) and heat-treating the hole transport layer at 150° C. for 30 minutes. On the hole transport layer, a 25 nm-thick quantum dot layer (HOMO: 5.7 eV, LUMO: 2.97 eV) is formed by spin-coating the ZnTeSe/ZnSeS core-shell quantum dot (peak emission wavelength: 453 nm) according to Synthesis Example 2 and heat-treating the quantum dot layer at 80° C. for 30 minutes. On the quantum dot layer, a 20 nm-thick $Zn_{0.85}Mg_{0.15}O$ electron auxiliary layer (HOMO: 7.4 eV, LUMO: 3.82 eV) is formed by spin-coating the $Zn_{0.85}Mg_{0.15}O$ nanoparticle solution (a solvent: ethanol, optical density: 0.5 arbitrary units (a.u.)) according to Synthesis Example 3 and heat-treating the $Zn_{0.85}Mg_{0.15}O$ electron auxiliary layer at 80° C. for 30 minutes. Subsequently, on the $Zn_{0.85}Mg_{0.15}O$ electron auxiliary layer, a 20 nm-thick ZnO electron auxiliary layer (HOMO: 7.54 eV, LUMO: 4.11 eV) is formed by spin-coating the ZnO nanoparticle solution (a solvent: ethanol, optical density: 0.5 a.u.) according to Synthesis Example 6 and heat-treating the ZnO electron auxiliary layer at 80° C. for 30 minutes. On the ZnO electron auxiliary layer, a second electrode is formed by vacuum-depositing aluminum (Al) to a thickness of 90 nm to manufacture a quantum dot device.

Example 2

A quantum dot device is manufactured according to the same method as Example 1 except for using a mixed solution of the $Zn_{0.85}Mg_{0.15}O$ nanoparticle solution according to Synthesis Example 3 and the ZnO solution according to Synthesis Example 6 in a weight ratio of 1:1 to form a 40 nm-thick single electron auxiliary layer (HOMO: 7.5 eV, LUMO: 3.82 eV) instead of the $Zn_{0.85}Mg_{0.15}O$ electron auxiliary layer and the ZnO electron auxiliary layer.

Example 3

A quantum dot device is manufactured according to the same method as Example 1 except for using the $Zn_{0.9}Mg_{0.1}O$ nanoparticle solution according to Synthesis Example 4 to form a $Zn_{0.9}Mg_{0.1}O$ electron auxiliary layer (HOMO: 7.5 eV, LUMO: 3.92 eV) instead of the $Zn_{0.85}Mg_{0.15}O$ nanoparticle solution according to Synthesis Example 3.

Example 4

A quantum dot device is manufactured according to the same method as Example 3 except for using a mixed solution of the $Zn_{0.9}Mg_{0.1}O$ nanoparticle solution according to Synthesis Example 4 and the ZnO solution according to Synthesis Example 6 in a weight ratio of 1:1 to form a 40 nm-thick single electron auxiliary layer (HOMO: 7.5 eV, LUMO: 3.94 eV) instead of the first electron auxiliary layer and the second electron auxiliary layer.

Example 5

A quantum dot device is manufactured according to the same method as Example 1 except for using the $Zn_{0.95}Mg_{0.05}O$ nanoparticle solution according to Synthesis Example 5 instead of the $Zn_{0.85}Mg_{0.15}O$ nanoparticle solution according to Synthesis Example 3 to form a $Zn_{0.95}Mg_{0.05}O$ electron auxiliary layer (HOMO: 7.5 eV, LUMO: 3.98 eV).

Example 6

A quantum dot device is manufactured according to the same method as Example 5 except for using a mixed solution of the $Zn_{0.95}Mg_{0.05}O$ nanoparticle solution according to Synthesis Example 5 and the ZnO solution according to Synthesis Example 6 in a weight ratio of 1:1 to form a 40 nm-thick single electron auxiliary layer (HOMO: 7.5 eV, LUMO: 3.97 eV) instead of the first electron auxiliary layer and the second electron auxiliary layer.

Comparative Example 1

A quantum dot device is manufactured according to the same method as Example 1 except for forming a 40 nm-thick single ZnO electron auxiliary layer without forming a $Zn_{0.85}Mg_{0.15}O$ electron auxiliary layer.

Comparative Example 2

A quantum dot device is manufactured according to the same method as Example 1 except for forming a 40 nm-thick single $Zn_{0.85}Mg_{0.15}O$ electron auxiliary layer without forming a ZnO electron auxiliary layer.

Comparative Example 3

A quantum dot device is manufactured according to the same method as Example 3 except for forming a 40 nm-thick single $Zn_{0.9}Mg_{0.1}O$ electron auxiliary layer without forming a ZnO electron auxiliary layer.

Comparative Example 4

A quantum dot device is manufactured according to the same method as Example 5 except for forming a 40 nm-thick single $Zn_{0.95}Mg_{0.05}O$ electron auxiliary layer without forming a ZnO electron auxiliary layer.

Evaluation II

Current-voltage-luminescence characteristics of the quantum dot devices according to Examples 1 and 2 and Comparative Examples 1 and 2 are evaluated.

The current-voltage-luminescence characteristics are evaluated by using a Keithley 220 current source and a Minolta CS200 spectroradiometer.

The results are shown in Table 2.

TABLE 2

|  | Example 1 | Example 2 | Comparative Example 1 | Comparative Example 2 |
|---|---|---|---|---|
| $EQE_{max}$ | 4.976 | 3.149 | 0.979 | 2.212 |
| EQE at 100 nit | 3.901 | 3.147 | 0.799 | 2.148 |
| $Cd/A_{max}$ | 3.280 | 1.891 | 0.539 | 1.203 |
| $Cd/m^2$ at 5 milliamperes (mA) | 112.301 | 94.231 | 22.924 | 57.797 |
| V at 5 mA | 5.675 | 5.385 | 4.556 | 5.726 |
| $\lambda_{max}$ | 454 | 454 | 454 | 454 |
| Full width at half maximum (FWHM) (nm) | 26 | 26 | 26 | 26 |
| CIE x | 0.1448 | 0.1445 | 0.1460 | 0.1471 |
| CIE y | 0.0600 | 0.0594 | 0.0547 | 0.0517 |

* $EQE_{max}$: maximum external quantum efficiency
* EQE at 100 nit: external quantum efficiency at 100 nit, which is equal to 100 candelas (Cd) per square meter ($m^2$)
* $Cd/A_{max}$: maximum current efficiency
* $Cd/m^2$ at 5 mA: luminance at 5 mA Referring to Table 2, the quantum dot devices according to Examples 1 and 2 exhibit reduced leakage currents and improved efficiency compared with the quantum dot devices according to Comparative Examples 1 and 2.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot device, comprising:
a first electrode and a second electrode facing each other, a work function of the first electrode being greater than a work function of the second electrode;
a quantum dot layer between the first electrode and the second electrode, the quantum dot layer comprising a blue light-emitting cadmium-free quantum dot; and
an electron auxiliary layer between the quantum dot layer and the second electrode, the electron auxiliary layer being a single electron auxiliary layer comprising a mixture of a first nanoparticle and a second nanoparticle, each of the first nanoparticle and the second nanoparticle being a zinc-containing oxide, and
wherein a lowest unoccupied molecular orbital energy level of the electron auxiliary layer is greater than a lowest unoccupied molecular orbital energy level of the quantum dot layer, and a difference between the lowest unoccupied molecular orbital energy level of the quantum dot layer and the lowest unoccupied molecular orbital energy level of the electron auxiliary layer is less than about 1.1 electronvolts.

2. The quantum dot device of claim 1, wherein an average particle size of the second nanoparticle is larger than an average particle size of the first nanoparticle.

3. The quantum dot device of claim 2, wherein
the average particle size of the first nanoparticle is in a range from about 1.5 nanometers to about 3.3 nanometers, and
the average particle size of the second nanoparticle is in a range from about 3.5 nm to about 5 nanometers.

4. The quantum dot device of claim 1, wherein
the first nanoparticle is represented by $Zn_{1-x}M_xO$ (wherein, M is Mg, Ca, Zr, W, Li, Ti, or a combination thereof, and $0.01 \leq x < 0.5$), and
the second nanoparticle is ZnO.

5. The quantum dot device of claim 1, wherein the lowest unoccupied molecular orbital energy level of the quantum dot layer is in a range from about 2.5 electronvolts to about 3.6 electronvolts, and a bandgap energy of the quantum dot layer is in a range from about 2.4 electronvolts to about 2.9 electronvolts.

6. The quantum dot device of claim 5,
the quantum dot comprises indium, zinc, and phosphorus, and
a mole ratio of the zinc relative to the indium is greater than or equal to about 25:1.

7. The quantum dot device of claim 5, wherein the quantum dot comprises zinc, tellurium, and selenium.

8. The quantum dot device of claim 7, wherein
the quantum dot comprises a core comprising zinc, tellurium, and selenium, and
a shell on at least a part of the core, the shell having a different composition than that of the core.

9. The quantum dot device of claim 8, wherein the shell comprises ZnSeS, ZnS, or a combination thereof.

10. A display device comprising the quantum dot device of claim 1.

11. A quantum dot device, comprising:
a first electrode and a second electrode facing each other, a work function of the first electrode being greater than a work function of the second electrode;
a quantum dot layer between the first electrode and the second electrode, the quantum dot layer comprising a blue light-emitting cadmium-free quantum dot; and
an electron auxiliary layer between the quantum dot layer and the second electrode,
wherein the electron auxiliary layer comprises
a first electron auxiliary layer close to the quantum dot layer between the quantum dot layer and the second electrode, the first electron auxiliary layer comprising a first nanoparticle, and
a second electron auxiliary layer close to the second electrode between the quantum dot layer and the second electrode, the second electron auxiliary layer comprising a second nanoparticle,
each of the first nanoparticle and the second nanoparticle is a zinc-containing oxide,
a lowest unoccupied molecular orbital energy level of the first electron auxiliary layer is less than a lowest unoccupied molecular orbital energy level of the second electron auxiliary layer, and
the lowest unoccupied molecular orbital energy level of the first electron auxiliary layer is greater than a lowest unoccupied molecular orbital energy level of the quantum dot layer.

12. The quantum dot device of claim 11, wherein an average particle size of the second nanoparticle is larger than an average particle size of the first nanoparticle.

13. The quantum dot device of claim 12, wherein
the average particle size of the first nanoparticle is in a range from about 1.5 nanometers to about 3.3 nanometers, and
the average particle size of the second nanoparticle is in a range from about 3.5 nm to about 5 nanometers.

14. The quantum dot device of claim 11, wherein
the first nanoparticle is represented by $Zn_{1-x}M_xO$ (wherein, M is Mg, Ca, Zr, W, Li, Ti, or a combination thereof, and $0.01 \leq x < 0.5$), and
the second nanoparticle is ZnO.

15. The quantum dot device of claim 11, wherein the lowest unoccupied molecular orbital energy level of the quantum dot layer is in a range from about 2.5 electronvolts to about 3.6 electronvolts, and
a difference between the lowest unoccupied molecular orbital energy level of the quantum dot layer and the lowest unoccupied molecular orbital energy level of the first electron auxiliary layer being less than about 1.1 eV.

16. The quantum dot device of claim 15, wherein the quantum dot comprises zinc, tellurium, and selenium.

17. The quantum dot device of claim 16, wherein
the quantum dot comprises a core comprising zinc, tellurium, and selenium, and
a shell on at least a part of the core, the shell having a different composition than that of the core.

18. The quantum dot device of claim 17, wherein the shell comprises ZnSeS, ZnS, or a combination thereof.

19. The quantum dot device of claim 15,
the quantum dot comprises indium, zinc, and phosphorus, and
a mole ratio of the zinc relative to the indium is greater than or equal to about 25:1.

20. A display device comprising the quantum dot device of claim 11.

* * * * *